NEGATIVE IMPEDANCE CONVERTER

Original Filed April 14, 1965 2 Sheets-Sheet 1

INVENTOR
Wolfgang Bitzer
BY Spencer & Kaye
ATTORNEYS

INVENTOR
Wolfgang Bitzer
BY Spencer & Kaye
ATTORNEYS 3,521,181
NEGATIVE IMPEDANCE CONVERTER
Wolfgang Bitzer, Backnang, Wurttemberg, Germany, assignor to Telefunken Patentverwertungsgesellschaft m.b.H., Ulm (Danube), Germany
Continuation of application Ser. No. 448,144, Apr. 14, 1965. This application Aug. 1, 1968, Ser No. 750,717
Claims priority, application Germany, Apr. 15, 1964, T 26,016
Int. Cl. H03f *3/18, 3/42*
U.S. Cl. 330—61 8 Claims

ABSTRACT OF THE DISCLOSURE

A negative impedance converter having first and second input and first and second output terminals. The second input and output terminals are connected directly together while the first input and output terminals are connected together by means of two resistors in series. An amplifier having a pair of first terminals and a pair of second terminals is connected such that one of the first terminals is joined to the juncture of the two resistors, the other of the first terminals is joined to the directly connected second converter input and output terminals, one of the second terminals is connected to the first converter input terminal and the other of the second terminals is joined to the first converter output terminal. The amplifier is a D.C. coupled transistor amplifier, has no inductances and is symmetrically constructed with respect to its pair of first and pair of second terminals.

This application is a continuation of Ser. No. 448,144, filed Apr. 14, 1965, now abandoned.

The present invention relates to an electric circuit and, more particularly, to a negative impedance converter.

German Pat. No. 974,956, describes a negative impedance converter essentially as depicted in FIG. 1 of the accompanying drawings, the same being a circuit diagram of a voltage inverting converter. The converter comprises a four-terminal network having input terminals 1, 1′, and output terminals 2, 2′. The terminals 1′, 2′, are connected directly to each other, while a series-circuit comprising the resistors $R_a$ and $R_b$ is interposed between the terminals 1 and 2. The juncture of these two resistors is connected to one of the input terminals A of an amplifier V whose other input terminal B is connected to the terminals 1′ and 2′. The output terminals C and D of the amplifier V are connected to the terminals 1 and 2, respectively. If the amplification is sufficiently high and if, within a predetermined frequency band, the phase-frequency characteristic of the amplifier is sufficiently small, the circuit will yield at one of the pairs of terminals 1, 1′ or 2, 2′, an impedance which is essentially a negative multiple, or a negative part, of a passive impedance which is connected to the other pair of terminals.

A practical circuit which is based on this principle, such as is shown in FIG. 6 of the mentioned German Pat. No. 974,956, has several drawbacks. For one thing, such a circuit incorporates a two-stage tube amplifier equipped with coupling capacitors and is therefore not suited for use—as is often the case—for low frequencies down to and including zero. Furthermore, the circuit requires two D.C. voltage sources.

It is, therefore, the primary object of the present invention to provide a negative impedance converter which overcomes the above drawbacks, which has a very stable conversion factor, and which can be used for frequencies all the way down to zero, i.e., to direct current.

With the above objects in view, the present invention resides in a negative impedance converter whose amplifier is in the form of a D.C. coupled transistorized amplifier that incorporates no inductances, and which converter is symmetrical with respect to the input terminals and to the output terminals of the amplifier.

Additional objects and advantages of the present invention will become apparent upon consideration of the following description when taken in conjunction with the accompanying drawings in which:

FIG. 1, already referred to above, is a circuit diagram of a prior art negative impedance converter showing the amplifier in block form, such as is disclosed in German Pat. No. 974,956.

Referring once again to the drawings and now to FIG. 2 thereof, the same shows a transistorized amplifier having input terminals A and B, output terminals C and D, two pnp-transistors T*s*1 and T*s*2, for instance of the type 2N1131, two npn-transistors T*s*3 and T*s*4 for instance of the type 2N1573, and six resistors $R_1$, $R_2$, $R_3$, $R_4$, $R_5$, $R_6$. Typical values of these resistances are: $R_1$=2000 ohms; $R_2$=$R_3$=4000 ohms; $R_4$=500 ohms; $R_5$=$R_6$=1000 ohms. The resistances $R_a$ and $R_b$ be may be each 1000 ohms. The input terminals A and B are connected to the bases of the two pnp-transistors T*s*1 and T*s*2, respectively, which are connected, via the common emitter resistor $R_1$ to the positive terminal of the D.C. source. The collectors of the transistors T*s*1 and T*s*2 are connected, via the respective collector resistors $R_2$ and $R_3$, to the negative terminal of the D.C. source and also to the bases of the two npn-transistors T*s*3 and T*s*4, respectively. The emitters of the two last-mentioned transistors T*s*3 and T*s*4 are connected via the common emitter resistor $R_4$, to the negative terminal of the D.C. source, while the collectors of the transistors T*s*3 and T*s*4 are connected via the respective collector resistors $R_5$ and $R_6$, to the positive terminal of this D.C. source. The collectors of the transistors T*s*3 and T*s*4 are also connected to the output terminals C and D, respectively. For reasons of symmetry, the resistors $R_2$ and $R_3$ have the same resistances, as do the resistors $R_5$ and $R_6$.

It will be seen from the above that a negative impedance converter using the above-described amplifier can be used for frequencies all the way down to zero, i.e., to D.C., inasmuch as the amplifier is D.C. coupled, i.e., the amplifier contains no coupling capacitors. Furthermore, the amplifier contains no inductance coils. The practical significance of this is that the circuit can be used in modern-day integrated circuits, so as to be suitable for use wherever microminiaturization is required. The circuit can also be used in inductance-free filter circuits.

In order to facilitate the practical construction of the circuit, particularly in the case of mass-production, the resistors used in the amplifier have such resistance values that their resistances will be at an integral ratio to each other and that only the resistance values of he resistors relative to each other, and not the absolute resistance values, will be of significance insofar as the operation of the converter is concerned.

Furthermore, thanks to the fact that the amplifier is symmetrical with respect to the input terminals as well as with respect to the output terminals, the amplifier is to a large extent unaffected by fluctuations in the voltage put out by the single voltage source to which it is connected, as well as unaffected by ambient temperature changes.

Figure 1:
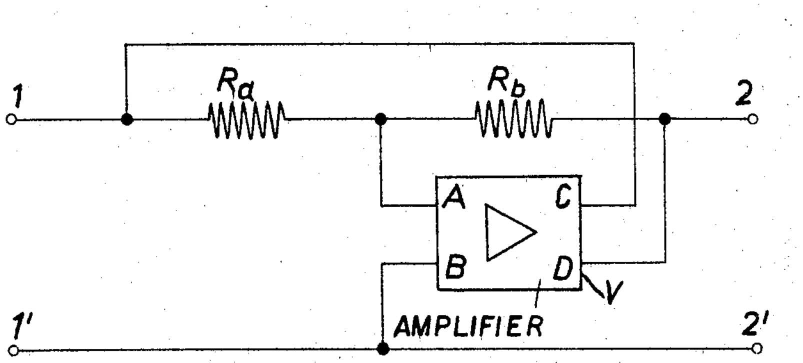
Fig. 1 PRIOR ART

The voltage inverting negative impedance converter shown in FIG. 1 may be modified to be a current inventing converter, as disclosed in IRE Transaction on Circuit Theory, vol. CT–4, September 1957, No. 3, page 129, FIG. 16. This may be done by changing the connections of the amplifier such that the current put out at the terminals C and D is applied to the juncture of the resistors $R_a$ and $R_b$ and the line between terminals 1′ and 2′, in the right direction, and by connecting the input terminals A and B to the terminals 1 and 2 of the converter. This can, in the case of the negative impedance converter according to the present invention be done simply by interchanging the input terminals A, B and output terminals C, D, so that there is obtained, in lieu of the voltage inverting converter of FIG. 2, a current inverting converter, as shown in FIG. 3.

Figure 2:
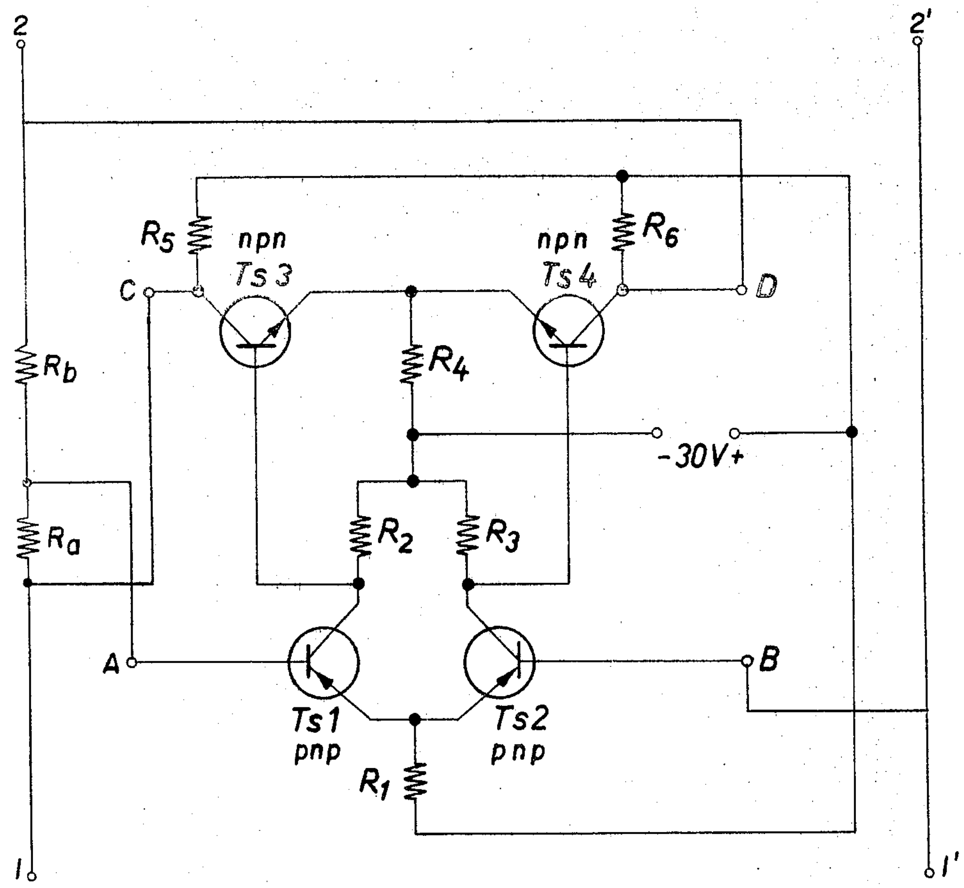
FIG. 2 is a circuit diagram of a negative impedance converter according to the present invention incorporating a transistorized amplifier according to the present invention.
Figure 3:
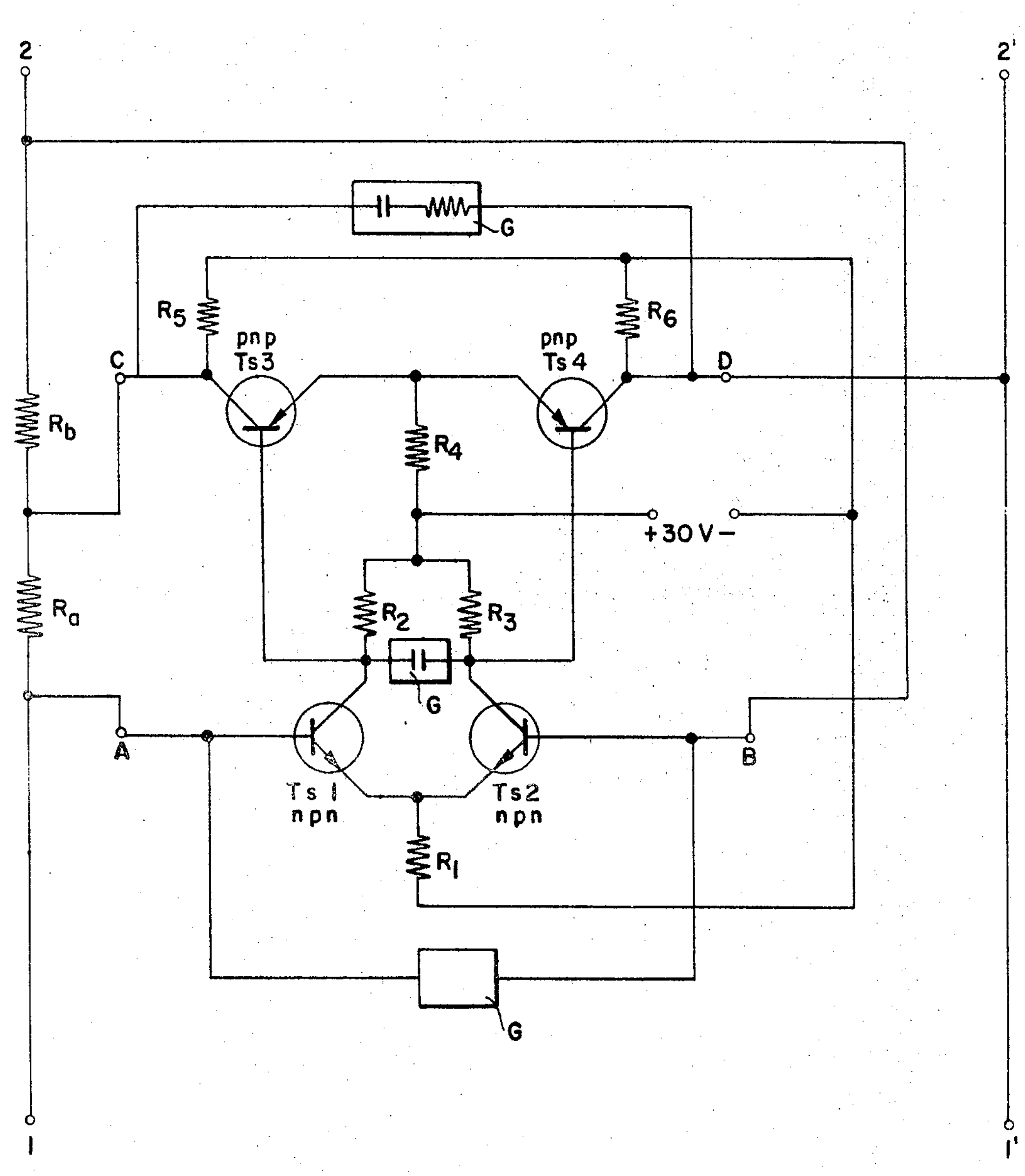
FIG. 3 is a circuit diagram of a modified negative impedance converter according to the present invention.

FIG. 3 also shows that the polarity of the circuit of FIG. 2 may be inverted, in that the transistors T*s*1 and T*s*2 may be npn-transistors and the transistors T*s*3 and T*s*4 pnp-transistors, in which case the polarity of the D.C. source will also be reversed with respect to that shown in FIG. 2.

In order to avoid A.C. instability, it will generally be advisable to set an upper limit to the bandwidth of the amplifier. As is also shown in FIG. 3, this can be done by connecting a two-terminal circuit G across the collectors of transistors T*s*1 and T*s*2 and/or by connecting another such circuit across the terminals A and B, and/or by connecting yet another such circuit across the terminals C and D. Each such stabilizing circuit may comprise a capacitor, or a series-circuit constituted by a capacitor and a resistor.

It will be appreciated that the various features of FIGS. 2 and 3 may be used interchangeably, i.e., either of the circuits of FIGS. 2 and 3 may be connected to have either of the polarities shown in the two figures, and any one or more of the stabilizing circuits G may be used in either of the circuits of FIGS. 2 and 3.

It will be understood that the above description of the present invention is susceptible to various modifications, changes, and adaptations, and the same are intended to be comprehended within the meaning and range of equivalents of the appended claims.

What is claimed is:

1. A negative impedance converter comprising, in combination:

(a) means forming first and second converter input terminals and first and second converter output terminals, said second converter input terminal and said second converter output terminal being connected directly to each other;

(b) two resistors connected in series-circuit between said first converter input terminal and said first converter output terminal;

(c) an amplifier having a first and second amplifier input terminal and a first and second amplifier output terminal and comprising, in combintaion:

(1) a first transistor whose base is connected to said first amplifier input terminal;

(2) a second transistor whose base is connected to said second amplifier input terminals;

(3) a first resistor whose one end is connected to the emitters of said first and second transistors and whose other end is connected to one pole of a D.C. voltage source;

(4) a second resistor whose one end is connected to the collector of said first transistor and whose other end is connected to the other pole of said D.C. voltage source;

(5) a third resistor whose one end is connected to the collector of said second transistor and whose other end is connected to said other pole of said D.C. voltage source;

(6) a third transistor whose base is connected to said collector of said first transistor and whose collector is connected to said first amplifier output terminal;

(7) a fourth transistor whose base is connected to said collector of said second transistor and whose collector is connected to said second amplifier output terminal;

(8) a fourth resistor whose one end is connected to the emitters of said third and fourth transistors and whose other end is connected to said other pole of said D.C. voltage source;

(9) a fifth resistor whose one end is connected to said collector of said third transistor and whose other end is connected to said one pole of said D.C. voltage source; and

(10) a sixth resistor whose one end is connected to said collector of said fourth transistor and whose other end is connected to said one pole of said D.C. voltage source;

said first amplifier input terminal being connected to said first converter input terminal, said second amplifier input terminal being connected to said first converter output terminal, said first amplifier output terminal being connected to the juncture of said two resistors and said second amplifier output terminal being connected to said directly connected together second converter input terminal and second converter output terminal, whereby said negative impedance converter operates as a current inverting converter.

2. A negative impedance converter as defined in claim 1 wherein said second and third resistors have the same resistances and wherein said fifth and sixth resistors have the same resistances.

3. A negative impedance converter as defined in claim 1 wherein all of said resistors have resistances the ratio of one to another of which is a whole number or the reciprocal value of a whole number.

4. A negative impedance converter as defined in claim 1 wherein said first and second transistors are pnp-transistors, wherein said third and fourth transistors are npn-transistors, and wherein said one pole of said D.C. voltage source is the positive terminal thereof and said other pole of said D.C. voltage source is the negative terminal thereof.

5. A negative impedance converter as defined in claim 1 wherein said first and second transistors are npn-transistors, wherein said third and fourth transistors are pnp-transistors, and wherein said one pole of said D.C. voltage source is the negative terminal thereof and said other pole of said D.C. voltage source is the positive terminal thereof.

6. A negative impedance converter as defined in claim 1, further comprising means for setting an upper limit to the bandwidth of the amplifier, said means comprising a two terminal circuit connected across said collectors of said first and second transistors.

7. A negative impedance converter as defined in claim 1 further comprising means for setting an upper limit to the bandwidth of the amplifier, said means comprising a two terminal circuit connected across said first and second amplifier input terminals.

8. A negative impedance converter as defined in claim 1, further comprising means for setting an upper limit to the bandwidth of the amplifier, said means comprising a two terminal circuit connected across said first and second amplifier output terminals.

References Cited

UNITED STATES PATENTS

| | | | |
|---|---|---|---|
| 2,726,370 | 12/1955 | Linvill et al. | 333—80 |
| 2,817,822 | 12/1957 | Meyers | 333—80 |
| 3,041,557 | 6/1962 | Sandberg | 333—80 |

| | | | |
|---|---|---|---|
| 2,817,822 | 12/1957 | Meyers | 333—80 |

| | | | |
|---|---|---|---|
| 3,077,566 | 2/1963 | Vosteen | 330—14 |

OTHER REFERENCES

"Filternics," Roddam, Thomas: Wireless World, August 1962.

NATHAN KAUFMAN, Primary Examiner

U.S. Cl. X.R.

330—17